US012718888B2

(12) United States Patent
Chen et al.

(10) Patent No.: US 12,718,888 B2
(45) Date of Patent: Aug. 25, 2026

(54) OPERATIONS ON PARTIALLY PROGRAMMED BLOCKS

(71) Applicant: Micron Technology, Inc., Boise, ID (US)

(72) Inventors: Hanping Chen, San Jose, CA (US); Zhongguang Xu, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 41 days.

(21) Appl. No.: 18/784,315

(22) Filed: Jul. 25, 2024

(65) Prior Publication Data

US 2025/0140325 A1 May 1, 2025

Related U.S. Application Data

(60) Provisional application No. 63/546,019, filed on Oct. 27, 2023, provisional application No. 63/594,205, filed on Oct. 30, 2023.

(51) Int. Cl.

| | |
|---|---|
| ***G11C 16/26*** | (2006.01) |
| ***G11C 16/04*** | (2006.01) |
| ***G11C 16/08*** | (2006.01) |
| ***G11C 16/14*** | (2006.01) |
| ***G11C 16/34*** | (2006.01) |

(52) U.S. Cl.

CPC .......... *G11C 16/26* (2013.01); *G11C 16/0483* (2013.01); *G11C 16/08* (2013.01); *G11C 16/14* (2013.01); *G11C 16/3418* (2013.01); *G11C 16/3459* (2013.01); *G11C 16/3445* (2013.01)

(58) Field of Classification Search

CPC . G11C 16/14; G11C 16/0483; G11C 16/3445; G11C 16/3418; G11C 16/3459; G11C 16/08; G11C 16/26

See application file for complete search history.

(56) References Cited

U.S. PATENT DOCUMENTS

| | | | | |
|---|---|---|---|---|
| 11,037,635 | B1 * | 6/2021 | Lien | G11C 16/10 |
| 12,141,446 | B2 * | 11/2024 | Ham | G06F 3/0679 |
| 2013/0272067 | A1 | 10/2013 | Lee et al. | |
| 2017/0169890 | A1 | 6/2017 | Griffin et al. | |
| 2018/0012667 | A1 * | 1/2018 | Costa | G11C 16/0483 |
| 2018/0374551 | A1 | 12/2018 | Hu | |
| 2020/0310643 | A1 | 10/2020 | Li et al. | |

* cited by examiner

*Primary Examiner* — Woo H Choi

(74) *Attorney, Agent, or Firm* — Brooks, Cameron & Huebsch, PLLC

(57) ABSTRACT

Apparatuses and methods for performing read operations on partially programmed blocks are provided. One example apparatus can include a controller configured to apply a read voltage to the first inner word line in the array of memory cells during a read operation on the first inner word line, apply a first pass voltage to a second inner word line adjacent to the first inner word line and to a third inner word line adjacent to the first inner word line, apply a second pass voltage to a number of unprogrammed word lines in the array of memory cells in response to determining the read request is for data stored on the first inner word line of the partially programmed block, and apply a third pass voltage to a first number of inner word lines of the number of word lines that are nonadjacent to the first inner word line.

17 Claims, 6 Drawing Sheets

OPERATIONS ON PARTIALLY PROGRAMMED BLOCKS

CROSS-REFERENCE TO RELATED APPLICATION

This application claims the benefit of U.S. Provisional Application No. 63/546,019, filed on Oct. 27, 2023, and claims the benefit of U.S. Provisional Application No. 63/594,205, filed on Oct. 30, 2023, the contents of which are incorporated herein by reference.

TECHNICAL FIELD

The present disclosure relates generally to read operations, and more particularly, to apparatuses and methods for read operations on partially programmed blocks.

BACKGROUND

A memory system can include a memory sub-system, which can be a storage device, a memory module, or a hybrid of a storage device and a memory module. Examples of a storage device include a solid-state drive (SSD), a Universal Flash Storage (UFS) drive, a secure digital (SD) card, an embedded Multiple Media Card (eMMC), and a hard disk drive (HDD). Examples of memory modules include a dual in-line memory module (DIMM) and various types of non-volatile dual in-line memory modules (NVDIMMs). Memory systems include one or more memory components (e.g., memory devices) that store data. The memory components can be, for example, non-volatile memory components (e.g., NAND flash memory devices) and volatile memory components (e.g., DRAM devices). In general, a host system can utilize a memory system to store data at the memory components and to retrieve data from the memory components.

DETAILED DESCRIPTION

Figure 1:
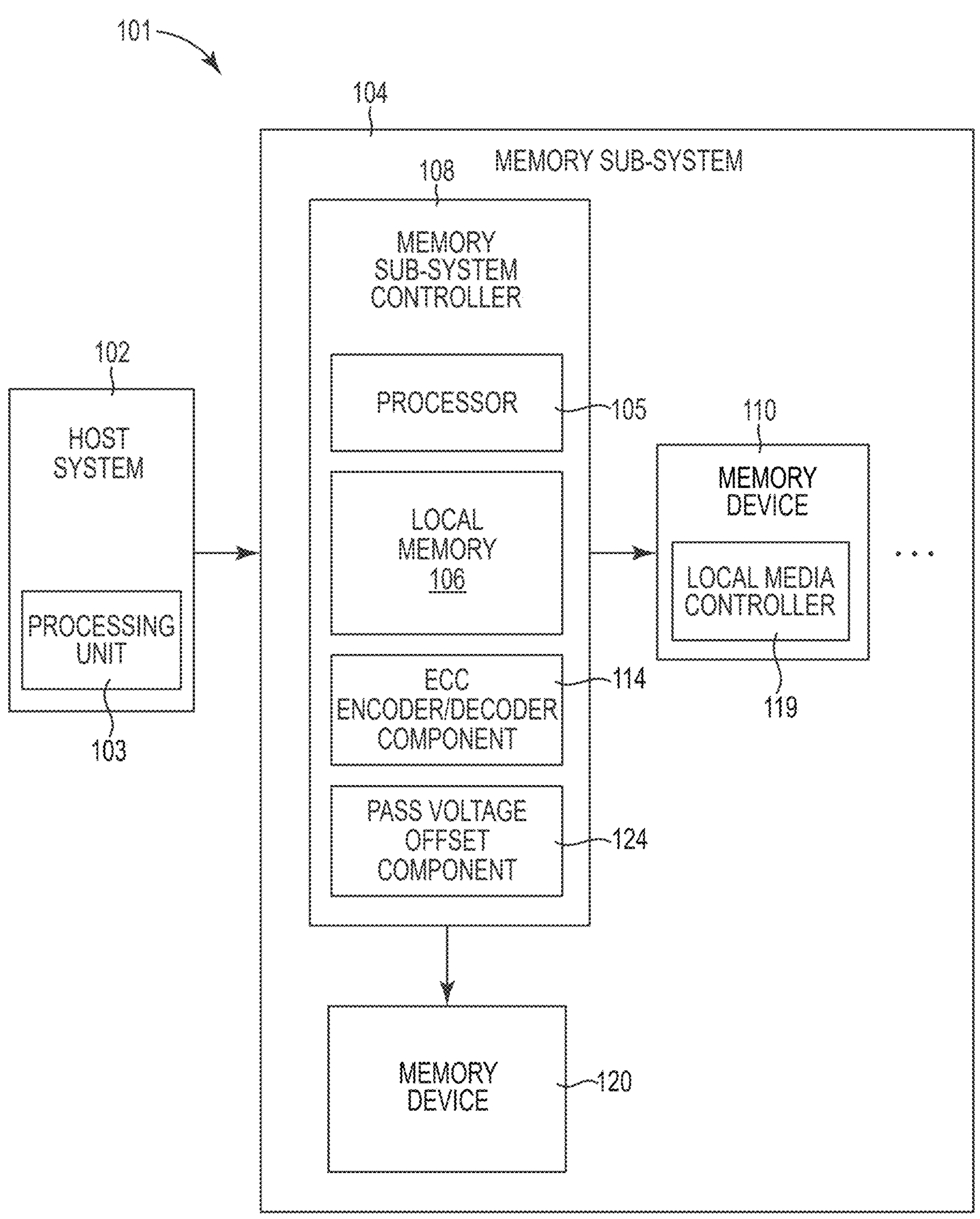
FIG. 1 illustrates an example computing system that includes a memory sub-system in accordance with embodiments of the present disclosure.

The present disclosure provides apparatuses and methods for performing read operations on partially programmed blocks. One example apparatus can include a controller configured to determine that a read request is for data stored on a first inner word line of a number of inner word lines of a partially programmed block, apply a read voltage to the first inner word line in the array of memory cells during a read operation on the first inner word line, apply a first pass voltage to a second inner word line adjacent to the first inner word line and to a third inner word line adjacent to the first inner word line during the read operation, apply a second pass voltage to a number of unprogrammed word lines in the array of memory cells during the read operation in response to determining the read request is for data stored on the first inner word line of the partially programmed block, and apply a third pass voltage to a first number of inner word lines of the number of word lines that are nonadjacent to the first inner word line.

When a memory device is being programmed, a read command may be received for data that is located in a partially programmed block (e.g., a block where a portion of the word lines are programmed and a portion of the word lines are unprogrammed in an erased state). During a read operation, the threshold voltage for memory cells in a partially programmed block can be different than the threshold voltage of memory cells in a fully programmed block due to the back pattern effect. When the same pass voltage is applied to the word lines that are not being sensed in a partially programmed block and in a fully programmed block, the word lines being sensed in a partially programmed block can have a lower threshold voltage than word lines being sensed in a fully programmed block due to a partially programmed block experiencing a different string current than a fully programmed block.

When reading memory cells, errors can occur that are caused by memory cells in a partially programmed block having lower threshold voltages when using sensing signals (e.g., read voltages and/or pass voltages) that are also used for fully programmed blocks. Embodiments of the present disclosure can reduce these errors by reducing the read pass voltage on unprogrammed word lines with a read pass voltage offset during read operations. The read pass voltage offsets can reduce the read pass voltages for unprogrammed word lines of a partially programmed block to reduce and/or eliminate the downward shift in threshold voltages when reading memory cells in a partially programmed block.

In a number of embodiments, when performing a read operation on a partially programmed block, a read pass voltage offset can be applied to lower the read pass voltages on unprogrammed word lines when reading the memory cells coupled to a word line being read. Lowering the read pass voltages on unprogrammed word lines during a read operation can reduce the drop in threshold voltage when reading the memory cells in a partially programmed block using read voltages and/or pass voltages on programmed word lines that are also used when reading memory cells in a fully programmed block, such that the threshold voltage distributions for word lines in partially programmed blocks read using the lowered read pass voltages on unprogrammed word lines of the present disclosure are similar to the threshold voltage distributions for word lines in fully programmed block read where the same read voltages can be used to read word lines in both partially programmed block and fully programmed blocks. Also, lowering the read pass voltages on unprogrammed word lines can reduce the supply current used during read operations on a partially programmed block.

In a number of embodiments, the read pass voltage offset can be calculated based on a quantity or relative quantity, such as percentage, of unprogrammed word lines in the partially programmed word lines and/or the read level of the read operation.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As used herein, "a number of" something can refer to one or more such things. For example, a number of memory cells can refer to one or more memory cells. Additionally, the designators "M" and "N" as used herein, particularly with respect to reference numerals in the drawings, indicates that a number of the particular feature so designated can be included with a number of embodiments of the present disclosure.

The figures herein follow a numbering convention in which the first bit or bits correspond to the drawing figure number and the remaining bits identify an element or component in the drawing. Similar elements or components between different figures may be identified by the use of similar bits. For example, 100 may reference element "00" in FIG. 1, and a similar element may be referenced as 600 in FIG. 6. Elements shown in the various embodiments herein can be added, exchanged, and/or eliminated so as to provide a number of additional embodiments of the present disclosure. In addition, the proportion and the relative scale of the elements provided in the figures are intended to illustrate the embodiments of the present disclosure, and should not be taken in a limiting sense.

FIG. 1 illustrates an example computing system 100 that includes a memory sub-system 104 in accordance with embodiments of the present disclosure. The memory sub-system 104 can include media, such as one or more volatile memory devices (e.g., memory device 120), one or more non-volatile memory devices (e.g., memory device 110), or a combination of such.

A memory sub-system 104 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, data server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device The computing system 100 can include a host system 102 that is coupled to one or more memory sub-systems 104. In some embodiments, the host system 102 is coupled to different types of memory sub-system 104. FIG. 1 illustrates one example of a host system 102 coupled to one memory sub-system 104. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 102 can include a processor chipset and a software stack executed by the processor chipset. The processor chipset can include one or more cores, one or more caches, a memory controller (e.g., an SSD controller), and a storage protocol controller (e.g., PCIe controller, SATA controller, CXL controller). The host system 102 uses the memory sub-system 104, for example, to write data to the memory sub-system 104 and read data from the memory sub-system 104.

The host system 102 includes a processing unit 103. The processing unit 103 can be a central processing unit (CPU) that is configured to execute an operating system. In some embodiments, processing unit 103 comprises a complex instruction set computer architecture, such an x86 or other architecture suitable for use as a CPU for a host system 102.

The host system 102 can be coupled to the memory sub-system 104 via a physical host interface. Examples of a physical host interface include, but are not limited to, a serial advanced technology attachment (SATA) interface, a compute express link (CXL) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 102 and the memory sub-system 104. The host system 102 can further utilize an NVM Express (NVMe) interface to access components (e.g., memory devices 110) when the memory sub-system 104 is coupled with the host system 102 by the PCIe interface. The physical host interface can provide an interface for passing control, address, data, and other signals between the memory sub-system 104 and the host system 102. FIG. 1 illustrates memory sub-system 104 as an example. In general, the host system 102 can access multiple memory sub-systems via a same communication connection, multiple separate communication connections, and/or a combination of communication connections.

The memory devices 110, 120 can include any combination of the different types of non-volatile memory devices and/or volatile memory devices. The volatile memory devices (e.g., memory device 120) can be, but are not limited to, random access memory (RAM), such as dynamic random-access memory (DRAM) and synchronous dynamic random access memory (SDRAM).

Some examples of non-volatile memory devices (e.g., memory device 110) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 110, 120 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, the memory device 110 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory device 110 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 110 can be based on any other type of non-volatile memory or storage device, such as such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 108 (or controller 108 for simplicity) can communicate with the memory device 110 to perform operations such as reading data, writing data, or erasing data at the memory device 110 and other such operations. The memory sub-system controller 108 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 108 can be a microcontroller, special purpose logic circuitry (e.g., a field programmable gate array (FPGA), an application specific integrated circuit (ASIC), etc.), or other suitable processors.

The memory sub-system controller 108 can include a processor 105 (e.g., a processing device) configured to execute instructions stored in a local memory 106. In the illustrated example, the local memory 106 of the memory sub-system controller 108 includes an embedded memory configured to store instructions for performing various processes, operations, logic flows, and routines that control operation of the memory sub-system 104, including handling communications between the memory sub-system 104 and the host system 102. Local memory 106 can include DRAM and/or static random access memory (SRAM).

In some embodiments, the local memory 106 can include memory registers storing memory pointers, fetched data, etc. The local memory 106 can also include read-only memory (ROM) for storing micro-code. While the example memory sub-system 104 in FIG. 1 has been illustrated as including the memory sub-system controller 108, in another embodiment of the present disclosure, a memory sub-system 104 does not include a memory sub-system controller 108, and can instead rely upon external control (e.g., provided by an external host, or by a processor or controller separate from the memory sub-system).

In general, the memory sub-system controller 108 can receive commands or operations from the host system 102 and can convert the commands or operations into instructions or appropriate commands to achieve the desired access to the memory device 110 and/or the memory device 120. The memory sub-system controller 108 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory device 110. The memory sub-system controller 108 can further include host interface circuitry to communicate with the host system 102 via the physical host interface. The host interface circuitry can convert the commands received from the host system into command instructions to access the memory device 110 and/or the memory device 120 as well as convert responses associated with the memory device 110 and/or the memory device 120 into information for the host system 102.

The memory sub-system 104 can also include additional circuitry or components that are not illustrated. In some embodiments, the memory sub-system 104 can include a cache or buffer (e.g., DRAM) and address circuitry (e.g., a row decoder and a column decoder) that can receive an address from the memory sub-system controller 108 and decode the address to access the memory device 110 and/or the memory device 120.

In some embodiments, the memory device 110 includes local media controller 119 that operates in conjunction with memory sub-system controller 108 to execute operations on one or more memory cells of the memory devices 110. An external controller (e.g., memory sub-system controller 108) can externally manage the memory device 110 (e.g., perform media management operations on the memory device 110). In some embodiments, memory device 110 is a managed memory device, which is a raw memory device combined with a local controller (e.g., local controller 119) for media management within the same memory device package. An example of a managed memory device is a managed NAND (MNAND) device.

The memory sub-system 104 can include an error correcting code (ECC) encoder/decoder component 114. Although not shown in FIG. 1 so as to not obfuscate the drawings, the ECC encoder/decoder component 114 can be implemented as firmware and/or include various circuitry to monitor, analyze, store, and/or allow for ECC operations by the memory sub-system 104. The ECC encoder/decoder component 114 can be a low-density parity-check (LDPC) encoder/decoder, for instance, which can encode/decode user data transferred between host system 102 and the memory devices 110 and/or 120.

The memory sub-system 104 can include pass voltage offset component 124. Although not shown in FIG. 1 so as to not obfuscate the drawings, the pass voltage offset component 124 can be implemented as firmware and/or include various circuitry to monitor, analyze, store, and/or allow for pass voltage offsets to be used by the memory sub-system 104 when reading data from the memory devices 110 and/or 120. The pass voltage offset component 124 can be used to determine pass voltage offsets to apply to the word lines that are not being read when performing a read operation on a partially programmed block. Pass voltage off sets can be determined by the pass voltage offset component 124 based on word line groups, such that each word line in the word line group can have the same pass voltage off sets applied when reading memory cells coupled a word line in a partially programmed block. The word line groups can be based upon the location of the word lines within a memory array (e.g., whether the word line is a programmed or unprogrammed and/or adjacent to a word line that is being read) and/or common electrical and/or physical characteristics of the word lines in a word line group.

Figure 2:
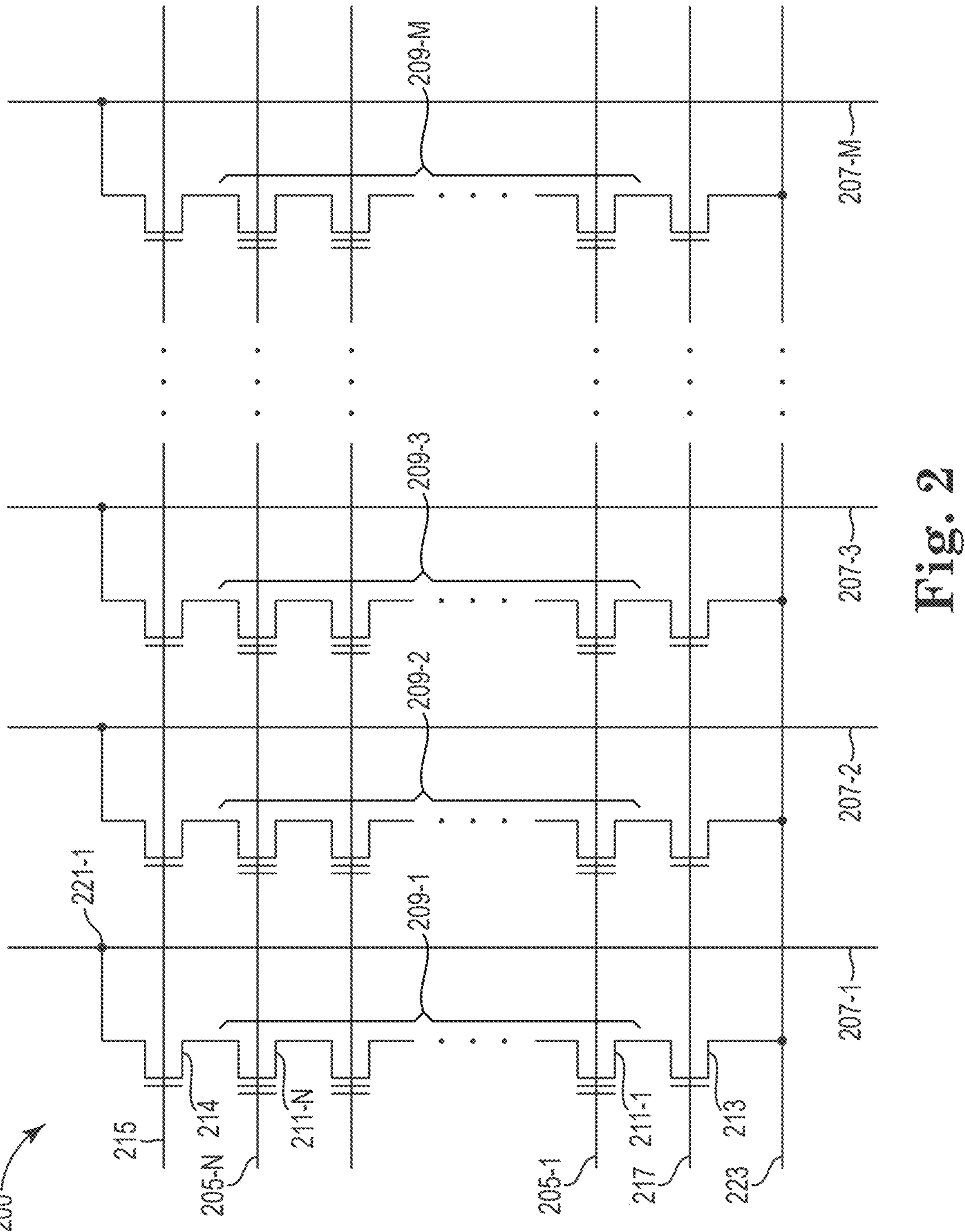
FIG. 2 illustrates a schematic diagram of a portion of a non-volatile memory array in accordance with embodiments of the present disclosure.

FIG. 2 illustrates a schematic diagram of a portion of a non-volatile memory array 200 in accordance with embodiments of the present disclosure. The embodiment of FIG. 2 illustrates a two-dimensional (2D) NAND architecture non-volatile memory array (e.g., NAND Flash). However, embodiments described herein are not limited to this example. Various types of memory, such as NAND flash memory, include a memory array of many memory cells that can be arranged in row and column fashion and grouped in physical blocks. The cells can include a charge storage node such as a floating gate or charge-trap layer which allows the cells to be programmed to store one or more bits by adjusting the charge stored on the storage node. Generally, an erase operation (e.g., a "block erase") is performed to erase all of the cells of a block together as a group. Although not illustrated, embodiments of the present disclosure can include three-dimensional (3D) flash memory (e.g., a 3D NAND memory array) that can include multiple strings of memory cells with each string comprising multiple series-coupled (e.g., source to drain) memory cells in a vertical direction, with the memory cells of a string sharing a common channel region. Each memory cell of a string can correspond to a different tier of the memory array, with a group of strings sharing multiple access lines, which may be referred to as word lines (WLs). Each access line can be coupled to respective memory cells of each string in the group of strings (e.g., the memory cells of a particular tier of the memory array). Groups of strings are coupled to respective sense lines, which may be referred to as data lines or bit lines (BLs), of a group of sense lines. The cells of the strings can be positioned between a drain-side select gate (referred to as a select gate drain (SGD)) and a source-side select gate (referred to as select gate source (SGS)) used to control access to the strings. A 3D NAND array can be a replacement gate (RG) NAND array or a floating gate NAND array, for example.

Memory array 200 includes access lines (e.g., word lines 205-1, . . . , 205-N), and intersecting data lines (e.g., local bit lines, 207-1, 207-2, 207-3, . . . , 207-M). For ease of addressing in the digital environment, the number of word lines 205-1, . . . , 205-N and the number of local bit lines 207-1, 207-2, 207-3, . . . , 207-M can be some power of two (e.g., 256 word lines by 4,096 bit lines).

Memory array 200 includes NAND strings 209-1, 209-2, 209-3, . . . , 209-M. Each NAND string includes non-volatile memory cells 211-1, . . . , 211-N, each communicatively coupled to a respective word line 205-1, . . . , 205-N. Each NAND string (and its constituent memory cells) is also associated with a local bit line 207-1, 207-2, 207-3, . . . , 207-M. The non-volatile memory cells 211-1, . . . , 211-N of each NAND string 209-1, 209-2, 209-3, . . . , 209-M are connected in series source to drain between a source select gate (SGS) (e.g., a field-effect transistor (FET)), 213, and a drain select gate (SGD) (e.g., FET) 214. Each source select gate 213 is configured to selectively couple a respective NAND string to a common source 223 responsive to a signal on source select line 217, while each drain select gate 214 is configured to selectively couple a respective NAND string to a respective bit line responsive to a signal on drain select line 215.

As shown in the embodiment illustrated in FIG. 2, a source of source select gate 213 is connected to a common source line 223. The drain of source select gate 213 is connected to the source of the memory cell 211-1 of the corresponding NAND string 209-1. The drain of drain select gate 214 is connected to bit line 207-1 of the corresponding NAND string 209-1 at drain contact 221-1. The source of drain select gate 214 is connected to the drain of the last memory cell 211-N (e.g., a transistor) of the corresponding NAND string 209-1.

In a number of embodiments, construction of non-volatile memory cells 211-1, . . . , 211-N includes a source, a drain, a charge storage structure such as a floating gate or charge trap layer, and a control gate. Non-volatile memory cells 211-1, . . . , 211-N have their control gates coupled to a word line, 205-1, . . . , 205-N, respectively. A "column" of the non-volatile memory cells, 211-1, . . . , 211-N, make up the NAND strings 209-1, 209-2, 209-3, . . . , 209-M, and are coupled to a given local bit line 207-1, 207-2, 207-3, . . . , 207-M, respectively. A "row" of the non-volatile memory cells are those memory cells commonly coupled to a given word line 205-1, . . . , 205-N. The use of the terms "column" and "row" is not meant to imply a particular linear (e.g., vertical and/or horizontal) orientation of the non-volatile memory cells. A NOR array architecture would be similarly laid out, except that the string of memory cells would be coupled in parallel between the select gates.

Subsets of cells coupled to a selected word line (e.g., 205-1, . . . , 205-N) can be programmed and/or read together as a page of memory cells. A programming operation (e.g., a write operation) can include applying a number of program pulses (e.g., 16V-20V) to a selected word line in order to increase the threshold voltage (Vt) of selected cells coupled to that selected access line to a desired program voltage level corresponding to a target (e.g., desired) state (e.g., charge storage state). State is equivalently referred to as "level" herein.

A read operation, which can also refer to a program verify operation, can include sensing a voltage and/or current change of a bit line coupled to a selected cell in order to determine the state of the selected cell. The states of a particular fractional bit memory cell may not correspond directly to a data value of the particular memory cell, rather the states of a group of memory cells including the particular memory cell together map to a data value having an integer number of bits. The read operation can include pre-charging a bit line using a bit line bias and detecting the discharge when a selected cell begins to conduct.

Determining (e.g., detecting) the state of a selected cell can include providing a number of sensing signals (e.g., read voltages) to a selected word line while providing a number of voltages (e.g., read pass voltages) to the word lines coupled to the unselected cells of the string sufficient to place the unselected cells in a conducting state independent of the threshold voltage of the unselected cells. The bit line corresponding to the selected cell being read and/or verified can be detected to determine whether or not the selected cell conducts in response to the particular sensing signal applied to the selected word line. For example, the state of a selected cell can be determined by the word line voltage at which the bit line current reaches a particular reference current associated with a particular state.

The array can comprise single level cells (SLCs) storing 1 bit per cell, multilevel cells (MLCs) storing 2 bits per cell, triple level cells (TLCs) storing three bits per cell, or quad level cells (QLCs) storing 4 bits per cell, for example. Embodiments are not limited to a particular type of memory cell.

MLCs can be two-bit (e.g., four-state) memory cells, or can store more than two bits of data per memory cell, including fractional bits of data per memory cell. For example, a two-bit memory cell can be programmed to one of four states (e.g., P0, P1, P2, and P3), respectively. In operation, a number of memory cells, such as in a selected block, can be programmed such that they have a Vt level corresponding to either P0, P1, P2, or P3. As an example, state P0 can represent a stored data value such as binary "11". State P1 can represent a stored data value such as binary "10". State P2 can represent a stored data value such as binary "00". State P3 can represent a stored data value such as binary "01". However, embodiments are not limited to these data value correspondence.

TLCs can be three-bit (e.g., eight-state) memory cells, or can store more than three bits of data per memory cell, including fractional bits of data per memory cell. For example, a three-bit memory cell can be programmed to one of eight states (e.g., P0, P1, P2, P3, P4, P5, P6, or P7), respectively. In operation, a number of memory cells, such as in a selected block, can be programmed such that they have a Vt level corresponding to either P0, P1, P2, P3, P4, P5, P6, or P7. As an example, state P0 can represent a stored data value such as binary "111". State P1 can represent a stored data value such as binary "110". State P2 can represent a stored data value such as binary "101". State P3 can represent a stored data value such as binary "100". State P4 can represent a stored data value such as binary "011". State P5 can represent a stored data value such as binary "010". State P6 can represent a stored data value such as binary "001". State P7 can represent a stored data value such as binary "000". However, embodiments are not limited to these data value correspondence.

QLCs can be four-bit (e.g., sixteen-state) memory cells, or can store more than four bits of data per memory cell, including fractional bits of data per memory cell. For example, a four-bit memory cell can be programmed to one of sixteen states (e.g., P0, P1, P2, P3, P4, P5, P6, P7, P8, P9, P10, P11, P12, P13, P14, or P15), respectively. In operation, a number of memory cells, such as in a selected block, can be programmed such that they have a Vt level corresponding to either P0, P1, P2, P3, P4, P5, P6, or P7. As an example, state P0 can represent a stored data value such as binary "1111". State P1 can represent a stored data value such as binary "1100". State P2 can represent a stored data value such as binary "1101". State P3 can represent a stored data value such as binary "1100". State P4 can represent a stored data value such as binary "1011". State P5 can represent a stored data value such as binary "1010". State P6 can represent a stored data value such as binary "1001". State P7 can represent a stored data value such as binary "1000". State P8 can represent a stored data value such as binary "0111". State P9 can represent a stored data value such as binary "0110". State P10 can represent a stored data value such as binary "0101". State P11 can represent a stored data value such as binary "0100". State P12 can represent a stored data value such as binary "0011". State P13 can represent a stored data value such as binary "0010". State P14 can represent a stored data value such as binary "0001". State P15 can represent a stored data value such as binary "0000". However, embodiments are not limited to these data value correspondence . . .

Figure 3A:
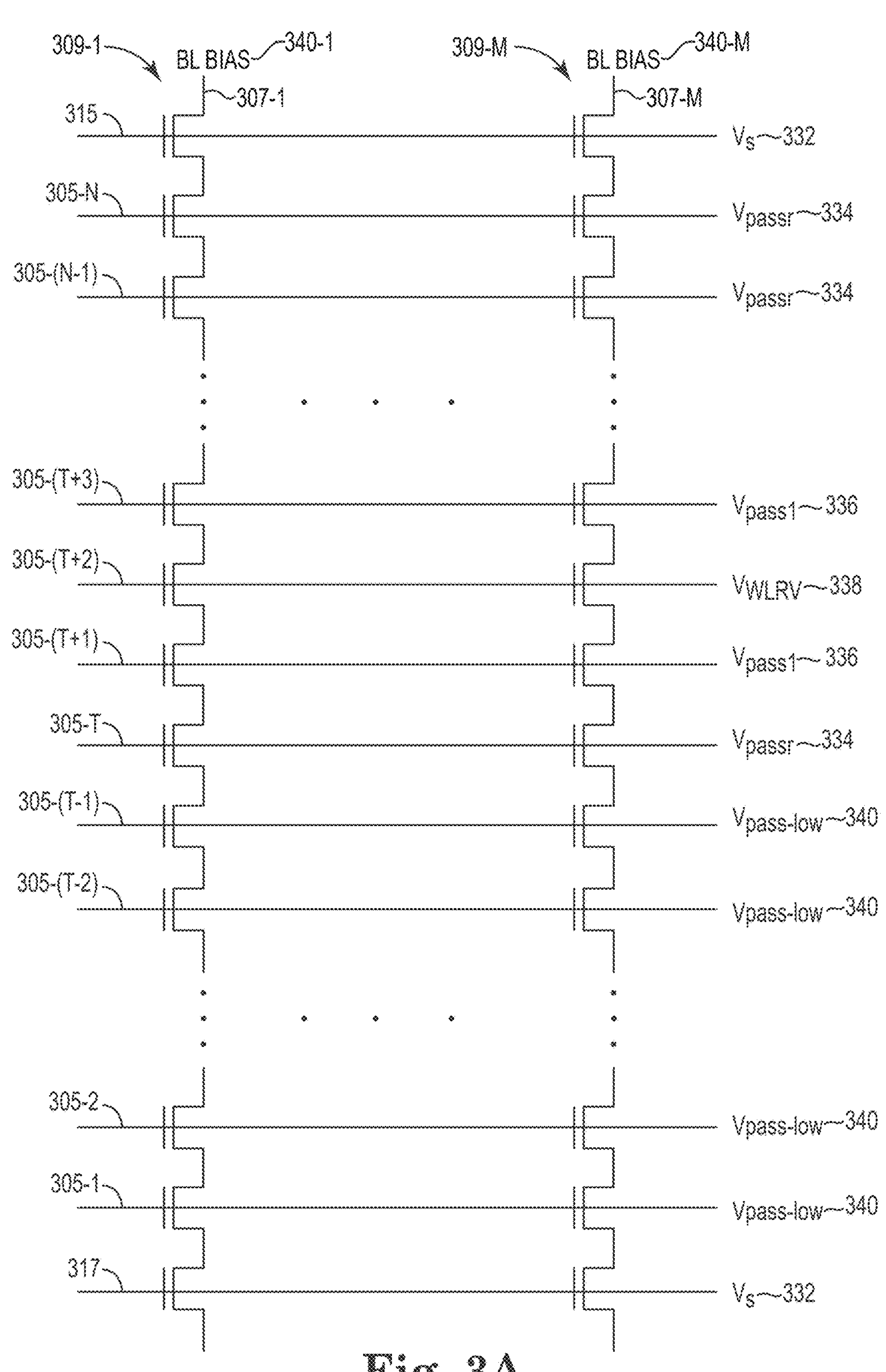
FIG. 3A illustrates operating voltages (e.g., bias conditions) associated with performing read operations on inner word lines of a partially programmed block in accordance with embodiments of the present disclosure.

FIG. 3A illustrates operating voltages (e.g., bias conditions) associated with performing read operations on inner word lines of a partially programmed block in accordance with embodiments of the present disclosure. FIG. 3A illustrates a number of strings 309-1, . . . , 309-M of memory cells with each string comprising memory cells coupled to corresponding word lines (referenced collectively as word lines 305). In the example illustrated in FIG. 3A, the strings 309-1, . . . , 309-M are part of a partially programmed block of memory cells. Word lines 305-(T+1) to 305-N are programmed and word lines 305-(T−1) to 305-1 are unprogrammed.

FIG. 3A illustrates a read operation on an inner word line, where the inner word lines are the programmed word lines of a partially programmed block that are nonadjacent to an unprogrammed word line. In FIG. 3A, the inner word lines are word lines 305-(T+1) to 305-N. A read operation on inner word line 305-(T+2) can include applying a word line read voltage (VWLRV) 338 to a selected word line (e.g., 305-(T+2)) while applying read pass voltages to the unselected word lines in a partially programmed block. For example, a first read pass voltage (Vpassr) 334 can be applied to unselected inner word lines 305-T and 305-(T+4) to 305-N, a second read pass voltage (Vpass1) 336 can be applied to unselected word lines 305-(T+3) and 305-(T+1) adjacent to selected word line 305-(T+2), and a third read pass voltage (Vpass−low) 340 can be applied to the unprogrammed word lines 305-1 to 305-(T−1). The read pass voltages can place the unselected word lines of the strings 309-1 to 309-M in a conducting state such that they pass current without regard to their Vt levels. The magnitude of Vpass−low 340 can be lower than the magnitude of Vpassr 334.

In this example, drain select line 315 and the source select line 317 are biased at a select voltage Vs 332 (e.g., 5V) which is sufficient to turn on the respective drain select gate (SGD) and source select gate (SGS) transistors. A bit line bias can be applied to bit lines 307-1, . . . , 307-M to read the memory cells coupled to word line 305-(T+2). For example, a bit line bias 340-1 can be applied to bit line 307-1 when reading the memory cell coupled word line 305-(T+2) and bit line 307-1 and a bit line bias 340-M can be applied to bit line 307-M when reading the memory cell coupled word line 305-(T+2) and bit line 307-M. Under the biasing conditions shown FIG. 3A, voltage and/or current levels on bit lines 307-1, . . . , 307-M in response to the particular applied word line read voltage (VWLRV) can be sensed by sensing circuitry (not shown) in order to determine a particular state (e.g., state P0, P1, P2, P3, P4, P5, P6, or P7) of the selected memory cells coupled to word line 305-(T+2) when the selected memory cells are TLC cells.

A read operation can be performed on any of the programmed word lines in a partially programmed block using read pass voltages, according to embodiments of the present disclosure. For example, in FIG. 3A, the partially programmed block includes programmed word lines 305-N to 305-T and unprogrammed word lines 305-(T−1) to 305-1, where word line 305-T is the boundary word line (e.g., the last programmed word line) in a partially programmed block and word lines 305-(T+1) to 305-N are inner word lines. In the example illustrated in FIG. 3A, word line 305-(T+2) is an inner word line so the read pass voltages illustrated in FIG. 3A could be used during read operations on inner word lines of a partially programmed block.

Figure 3B:
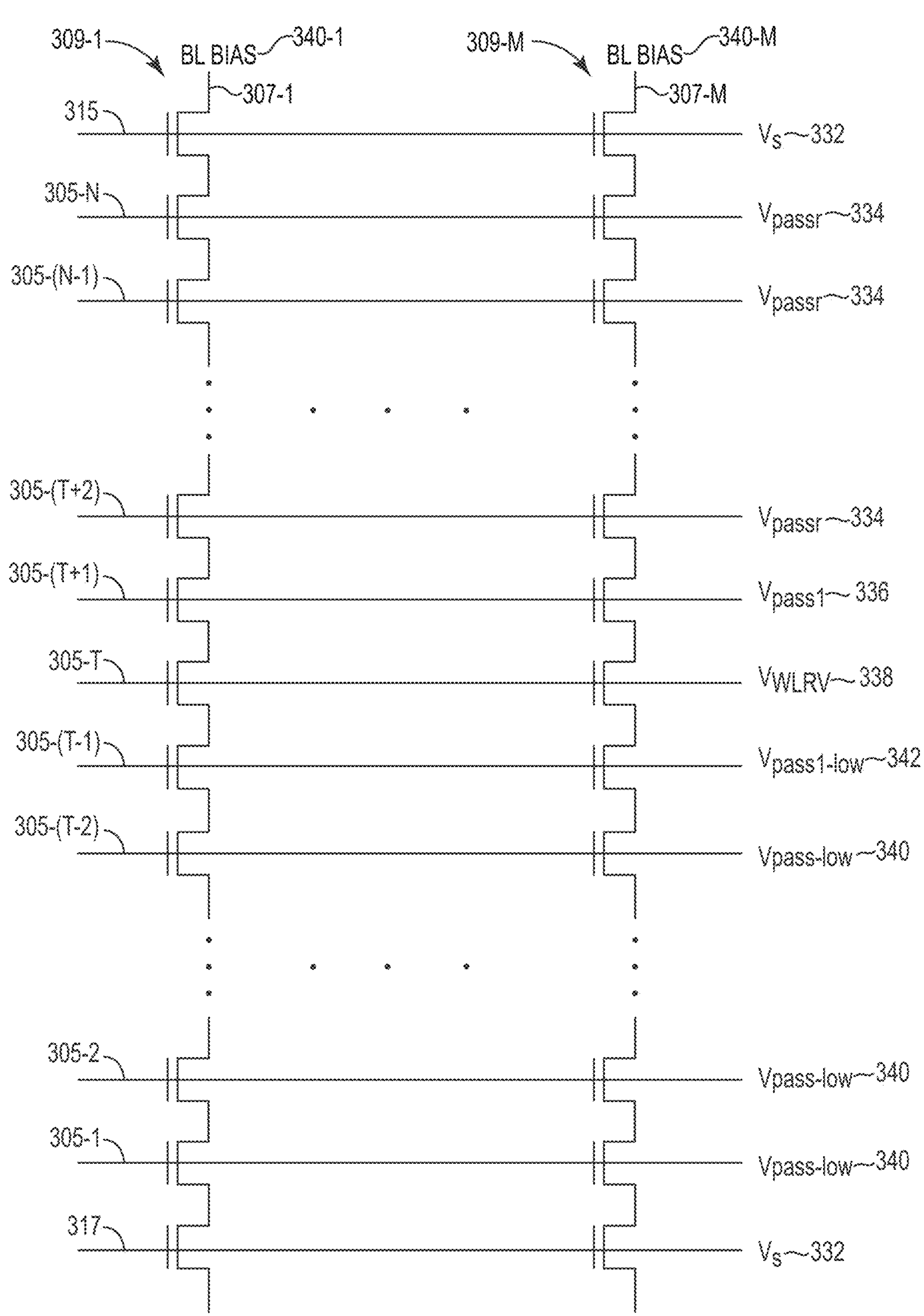
FIG. 3B illustrates operating voltages (e.g., bias conditions) associated with performing read operations on a boundary word line of a partially programmed block in accordance with embodiments of the present disclosure.

FIG. 3B illustrates operating voltages (e.g., bias conditions) associated with performing read operations on a boundary word line of a partially programmed block in accordance with embodiments of the present disclosure. FIG. 3B illustrates a number of strings 309-1, . . . , 309-M of memory cells with each string comprising memory cells coupled to corresponding word lines (referenced collectively as word lines 305). In the example illustrated in FIG. 3B, the strings 309-1, . . . , 309-M are part of a partially programmed block of memory cells. Word lines 305-(T+1) to 305-N are programmed and word lines 305-(T−1) to 305-1 are unprogrammed.

FIG. 3B illustrates a read operation on boundary word line, where the boundary word line is the last programmed word line of a partially programmed block and is adjacent to the first unprogrammed word line of a partially programmed block. In FIG. 3B, the boundary word line is word line 305-T. A read operation on boundary word line 305-T can include applying a word line read voltage (VWLRV) 338 to a selected word line (e.g., 305-T) while applying read pass voltages to the unselected word lines in a partially programmed block. For example, a first read pass voltage (Vpassr) 334 can be applied to unselected inner word lines 305-(T+2) to 305-N, a second read pass voltage (Vpass1) 336 can be applied to unselected inner word line 305-(T+1) adjacent to selected word line 305-T, a third read pass voltage (Vpass1−low) 342 can be applied to unselected unprogrammed word line 305-(T−11) adjacent to selected word line 305-T, and a fourth read pass voltage (Vpass−low) 340 can be applied to the unprogrammed word lines 305-1 to 305-(T−2) nonadjacent to the selected boundary word line 305-T. The read pass voltages can place the unselected word lines of the strings 309-1 to 309-M in a conducting state such that they pass current without regard to their Vt levels. The magnitude of Vpass−low 340 can be lower than the magnitude of Vpassr 334 and the magnitude of Vpass1−low 342 can be lower than the magnitude of Vpass1 336. Also, the magnitude of Vpass−low 340 and Vpassr 334 can be lower than the magnitude of Vpass1−low 342 and Vpass1 336.

In this example, drain select line 315 and the source select line 317 are biased at a select voltage Vs 332 (e.g., 5V) which is sufficient to turn on the respective drain select gate (SGD) and source select gate (SGS) transistors. A bit line bias can be applied to bit lines 307-1, . . . , 307-M to read the memory cells coupled to word line 305-T. For example, a bit line bias 340-1 can be applied to bit line 307-1 when reading the memory cell coupled word line 305-T and bit line 307-1 and a bit line bias 340-M can be applied to bit line 307-M when reading the memory cell coupled word line 305-T and bit line 307-M. Under the biasing conditions shown FIG. 3B, voltage and/or current levels on bit lines 307-1, . . . , 307-M in response to the particular applied word line read voltage (VWLRV) can be sensed by sensing circuitry (not shown) in order to determine a particular state (e.g., state P0, P1, P2, P3, P4, P5, P6, or P7) of the selected memory cells coupled to word line 305-(T+2) when the selected memory cells are TLC cells.

A read operation can be performed on any of the programmed word lines in a partially programmed block using read pass voltages, according to embodiments of the present disclosure. For example, in FIG. 3B, the partially programmed block includes programmed word lines 305-N to 305-T and unprogrammed word lines 305-(T−1) to 305-1, where word line 305-T is the boundary word line (e.g., the last programmed word line) in a partially programmed block. The read pass voltages illustrated in FIG. 3B can be used during a read operation on a boundary word line (e.g., word line 305-T) of a partially programmed block.

Figures 4A, 4B:
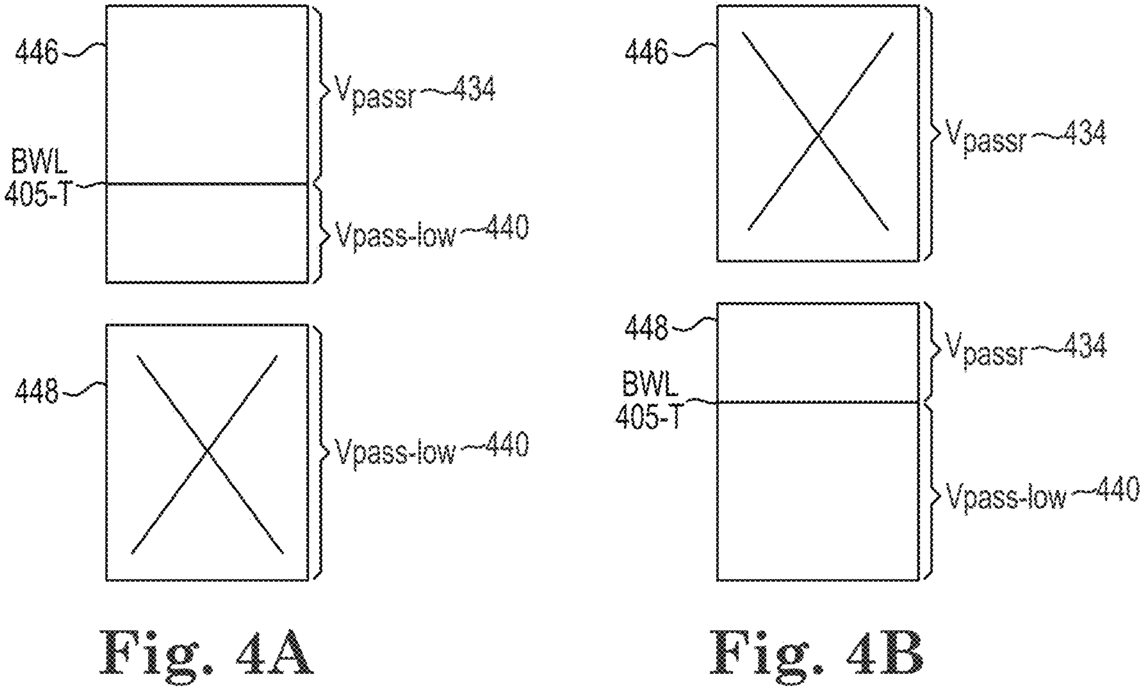
FIG. 4A illustrates operating voltages (e.g., bias conditions) associated with performing read operations on an upper half good block in accordance with embodiments of the present disclosure.
FIG. 4B illustrates operating voltages (e.g., bias conditions) associated with performing read operations on a lower half good block in accordance with embodiments of the present disclosure.

FIG. 4A illustrates operating voltages (e.g., bias conditions) associated with performing read operations on an upper half good block in accordance with embodiments of the present disclosure. A block can be partitioned where the block includes a good portion and bad portion, where the good portion is used to write and/or read data and the bad portion is not used to read and/or write data. For example, in FIG. 4A, a block is partitioned into an upper half good block configuration where upper half 446 is a upper half good block that is used to read and/or write data and lower half 448 is a lower half bad block that is not used to read and/or write data and is in an unprogrammed state. The partitions of the block into good portions and bad portions illustrated in FIG. 4A are half blocks, but embodiments are not limited to half blocks.

In FIGS. 4A, upper half good block 446 can be a partially programmed block, where word line 405-T is the boundary word line (BWL). When reading data from a programmed word line of the partially programmed upper half good block 446, read pass voltage (Vpassr) 434 can be applied to the unselected programmed word lines and read pass voltage (Vpass−low) 440 can be applied to the unselected unprogrammed word lines. Also, read pass voltage (Vpass−low) 440 can be applied to the word lines of the lower half bad block 448. The word lines of lower half bad block 448 are unprogrammed state and therefore applying Vpass−low 440 to the word lines of lower half bad block 448 can reduce the threshold voltage shift associated with reading word lines in a partially programmed block.

FIG. 4B illustrates operating voltages (e.g., bias conditions) associated with performing read operations on a lower half good block in accordance with embodiments of the present disclosure. A block can be partitioned where the block includes a good portion and bad portion, where the good portion is used to write and/or read data and the bad portion is not used to read and/or write data. For example, in FIG. 4B, a block is partitioned into a lower half good block configuration where an upper half 446 is a upper half bad block that is not used to read and/or write data and is in an unprogrammed state; and lower half 448 is a lower half good block that is used to read and/or write data. The partitions of the block into good portions and bad portions illustrated in FIG. 4B are half blocks, but embodiments are not limited to half blocks.

In FIGS. 4B, the lower half good block 448 can be a partially programmed block, where word line 405-T is the boundary word line (BWL). When reading data from a programmed word line of the partially programmed lower half good block 448 read pass voltage (Vpassr) 434 can be applied to the unselected programmed word lines and read pass voltage (Vpass−low) 440 can be applied to the unselected unprogrammed word lines. Also, read pass voltage (Vpassr) 334 can be applied to the word lines of the upper half bad block 446. The word lines of upper half bad block 446 are unprogrammed state but Vpassr 334 can be applied to the word lines of upper half bad block 446 while still reducing the threshold voltage shift associated with reading word lines in a partially programmed block.

Figure 5:
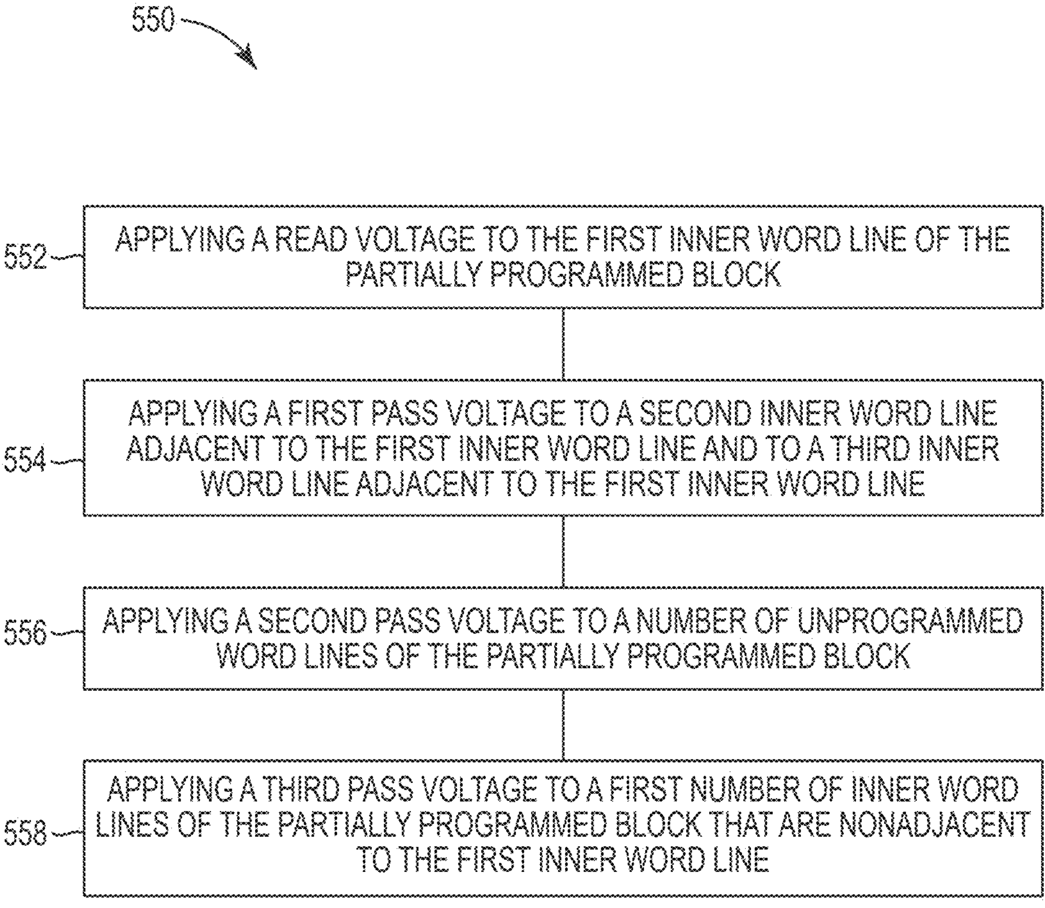
FIG. 5 is a flow diagram illustrating a method for operating a controller configured for read operations on partially programmed blocks in accordance with embodiments of the present disclosure.

FIG. 5 is a flow diagram illustrating a method for operating a controller configured for read operations on partially programmed blocks in accordance with embodiments of the present disclosure. The method 550 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, method 550 can be performed using the word line offset component 124 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At 552, the method can include applying a read voltage to the first inner word line of the partially programmed block.

At 554, the method can include applying a first pass voltage to a second inner word line adjacent to the first inner word line and to a third inner word line adjacent to the first inner word line. The first pass voltage can be a Vpass1 voltage that can be applied to the word lines adjacent to a selected word line.

At 556, the method can include applying a second pass voltage to a number of unprogrammed word lines of the partially programmed block.

At 558, the method can include applying a third pass voltage to a first number of inner word lines of the partially programmed block that are nonadjacent to the first inner word line. The second pass voltage can be a pass voltage with a lower magnitude than the pass voltage that the third pass voltage that is applied to the unselected inner word lines of the partially programmed block.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:

an array of memory cells;

a controller coupled to the array of memory cells and the controller including a non-transitory machine-readable medium in communication with a processor where the non-transitory machine-readable medium stores instructions executable by the processor to:

determine that a read request is for data stored on a first inner word line of a number of inner word lines of a partially programmed block; and apply a read voltage to the first inner word line in the array of memory cells during a read operation on the first inner word line;

apply a first pass voltage to a second inner word line adjacent to the first inner word line and to a third inner word line adjacent to the first inner word line during the read operation;

apply a second pass voltage to a number of unprogrammed word lines in the array of memory cells during the read operation in response to determining the read request is for data stored on the first inner word line of the partially programmed block;

apply the second pass voltage to word lines in a lower half bad block when the partially programmed block includes an upper half good block; and apply a third pass voltage to a first number of inner word lines of the number of word lines that are nonadjacent to the first inner word line.

2. The apparatus of claim 1, wherein the partially programmed block comprises a number of programmed word lines that include the number of inner word lines and a boundary word line.

3. The apparatus of claim 2, wherein the partially programmed block comprises the number of unprogrammed word lines and wherein a first unprogrammed word line of the number of unprogrammed word lines is adjacent to the boundary word line.

4. The apparatus of claim 1, wherein a magnitude of the second pass voltage is less than a magnitude of the third pass voltage.

5. The apparatus of claim 1, wherein a magnitude of the second pass voltage and a magnitude of the third pass voltage are less than a magnitude of the first pass voltage.

6. The apparatus of claim 1, wherein the controller is configured to apply the third pass voltage to word lines in an upper half bad block when the partially programmed block includes a lower half good block.

7. An apparatus, comprising:

an array of memory cells;

a controller coupled to the array of memory cells and the controller including a non-transitory machine-readable medium in communication with a processor where the non-transitory machine-readable medium stores instructions executable by the processor to:

determine that a read request is for data stored on a boundary word line of a partially programmed block; and apply a read voltage to the boundary word line in the array of memory cells during a read operation on the boundary word line;

apply a first pass voltage to an inner word line adjacent to the boundary word line during the read operation on the boundary word line;

apply a second pass voltage to an unprogrammed word line adjacent to the boundary word line during the read operation on the boundary word line;

apply a third pass voltage to a number of unprogrammed word lines in the array of memory cells during the read operation on the boundary word line;

apply the third pass voltage to word lines in a lower half bad block in response to the partially programmed block being an upper half good block; and apply a fourth pass voltage to a first number of inner word lines that are nonadjacent to the inner word line during the read operation on the boundary word line.

8. The apparatus of claim 7, wherein the partially programmed block comprises a number of programmed word lines that include the inner word line, the first number of inner word lines, and the boundary word line.

9. The apparatus of claim 8, wherein the partially programmed block comprises the number of unprogrammed word lines and the unprogrammed word line adjacent to the boundary word line.

10. The apparatus of claim 7, wherein a magnitude of the second pass voltage is less than a magnitude of the first pass voltage.

11. The apparatus of claim 7, wherein a magnitude of the third pass voltage is less than a magnitude of the second pass voltage.

12. The apparatus of claim 7, wherein a magnitude of the fourth pass voltage is greater than a magnitude of the third pass voltage.

13. A method, comprising:

performing a read operation on a first inner word line of a number of word lines of a partially programmed block in a memory array, wherein performing the read operation includes:

applying a read voltage to the first inner word line of the partially programmed block;

applying a first pass voltage to a second inner word line adjacent to the first inner word line and to a third inner word line adjacent to the first inner word line;

applying a second pass voltage to a number of unprogrammed word lines of the partially programmed block;

applying the second pass voltage to word lines in a lower half bad block when the partially programmed block is an upper half good block; and applying a third pass voltage to a first number of inner word lines of the partially programmed block that are nonadjacent to the first inner word line.

14. The method of claim 13, wherein a magnitude of the second pass voltage is less than a magnitude of the third pass voltage.

15. The method of claim 13, wherein a magnitude of the second pass voltage and a magnitude of the third pass voltage are less than a magnitude of the first pass voltage.

16. The method of claim 13, wherein the partially programmed block comprises a number of programmed word lines that include the number of inner word lines and a boundary word line and wherein the partially programmed block comprises the number of unprogrammed word lines and wherein a first unprogrammed word line of the number of unprogrammed word lines is adjacent to the boundary word line.

17. The method of claim 13, further including applying the third pass voltage to an upper half bad block in response to the partially programmed block being a lower half good block.

* * * * *